(12) United States Patent
Jung et al.

(10) Patent No.: US 10,038,027 B2
(45) Date of Patent: Jul. 31, 2018

(54) CMOS IMAGE SENSOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Dae-Sub Jung, Shanghai (CN); Deyan Chen, Shanghai (CN); Xuejie Shi, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/396,878

(22) Filed: Jan. 3, 2017

(65) Prior Publication Data

US 2017/0200758 A1 Jul. 13, 2017

(30) Foreign Application Priority Data

Jan. 7, 2016 (CN) .......................... 2016 1 0008022

(51) Int. Cl.
*H01L 21/00* (2006.01)
*H01L 27/146* (2006.01)

(52) U.S. Cl.
CPC .... *H01L 27/14643* (2013.01); *H01L 27/1461* (2013.01); *H01L 27/14612* (2013.01); *H01L 27/14689* (2013.01)

(58) Field of Classification Search
CPC ......... H01L 27/14643; H01L 27/14689; H01L 27/1461
See application file for complete search history.

(56) References Cited

U.S. PATENT DOCUMENTS

| | | | |
|---|---|---|---|
| 6,489,643 B1 * | 12/2002 | Lee | H01L 27/14603 257/233 |
| 6,767,312 B2 * | 7/2004 | Shim | H01L 27/14609 257/292 |

(Continued)

FOREIGN PATENT DOCUMENTS

EP 1648031 A1 * 4/2006 ....... H01L 27/14632

OTHER PUBLICATIONS

The European Patent Office (EPO) The Extended European Search Report for 16207190.6 dated Jun. 2, 2017 7 Pages.

(Continued)

*Primary Examiner* — Laura Menz
(74) *Attorney, Agent, or Firm* — Anova Law Group, PLLC

(57) ABSTRACT

The present disclosure provides CMOS image sensors and fabrication methods thereof. An exemplary fabrication process of a CMOS image sensor includes providing a substrate having a first region and a second region connecting with the first region at a first end of the first region; forming a transfer transistor on surface of the substrate in the second region; forming a first implanting region in the substrate in the first region using a first mask; forming a second implanting region in the first implanting region by, the first implanting region being separated into a third implanting region on the second implanting region and a fourth implanting region under the second implanting region; forming a fifth region in (Continued)

the second region at the first end using a second mask, connecting the third implanting region with the fourth implanting region.

14 Claims, 4 Drawing Sheets

(56) References Cited

U.S. PATENT DOCUMENTS

| | | | | |
|---|---|---|---|---|
| 7,154,137 | B2 * | 12/2006 | Nozaki | H01L 27/14632 |
| | | | | 257/292 |
| 7,420,233 | B2 * | 9/2008 | Rhodes | H01L 27/14601 |
| | | | | 257/292 |
| 7,495,273 | B2 * | 2/2009 | Patrick | H01L 27/14603 |
| | | | | 257/291 |
| 7,701,030 | B2 * | 4/2010 | Roy | H01L 27/14603 |
| | | | | 257/463 |
| 7,705,379 | B2 * | 4/2010 | Adachi | H01L 27/14609 |
| | | | | 257/291 |
| 7,737,475 | B2 * | 6/2010 | Hynecek | H01L 27/14609 |
| | | | | 257/222 |
| 8,039,882 | B2 * | 10/2011 | Mouli | H01L 27/148 |
| | | | | 257/292 |
| 2003/0030083 | A1 * | 2/2003 | Lee | H01L 27/14603 |
| | | | | 257/292 |
| 2004/0173799 | A1 * | 9/2004 | Patrick | H01L 27/14601 |
| | | | | 257/72 |
| 2005/0087782 | A1 * | 4/2005 | Rhodes | H01L 27/14601 |
| | | | | 257/292 |
| 2007/0158771 | A1 * | 7/2007 | Hynecek | H01L 27/14603 |
| | | | | 257/431 |
| 2012/0242875 | A1 | 9/2012 | Nakamura | |
| 2013/0193539 | A1 | 8/2013 | Jeng et al. | |
| 2017/0200758 | A1 * | 7/2017 | Jung | H01L 27/1461 |

OTHER PUBLICATIONS

Zhongxiang Cao et al., "Design of Pixel for High Speed CMOS Image Sensors", Institute of Semiconductors, Chinese Academy of Sciences, pp. 1-4, Beijing, China.

Younsub Lim et al., "Stratified Photodiode a New Concept for Small Size-High Performance CMOS Image Sensor Pixels", MagnaChip Semiconductor Ltd., pp. 1-4. Korea.

* cited by examiner

CMOS IMAGE SENSOR AND FABRICATION METHOD THEREOF

CROSS-REFERENCES TO RELATED APPLICATIONS

This application claims the priority of Chinese patent application No. 201610008022.1 filed on Jan. 7, 2016, the entirety of which is incorporated herein by reference.

FIELD OF THE INVENTION

The present invention generally relates to the field of semiconductor manufacturing and, more particularly, related to CMOS image sensors and fabrication processes thereof.

BACKGROUND

Image sensors, i.e. photosensitive devices, are apparatus that convert optical images into electrical signals. Image sensors have been widely used in digital cameras and other optical electronic devices. According to the electronic components, image sensors are categorized into two types: Charge Coupled device (CCD) image sensors and Complementary Metal-Oxide semiconductor (CMOS) image sensors (CIS). Comparing with the CCD image sensors, the CMOS image sensors have lower production cost, lower power consumption; and higher integration level, etc. Thus, the CMOS image sensors have a rapid development on the aspects of wide dynamic range and low illumination, etc.

CMOS image sensors are a typical type of solid state image sensors. A CMOS image sensor often includes a pixel unit array, a row driver, a column driver, a logic timer control, an AD convertor, a data bus output terminal, and a control terminal, etc. The operation of the CMOS image sensor often includes reset, optical-electrical conversion, integration, and data reading, etc. Among the components of the CMOS image sensor, the pixel units are among the key components. As the basic optical sensing units, the pixel units determine the image quality of the CMOS image sensor.

According to the pixel structure, the CMOS image sensors are categorized into passive pixel sensors (PPS) and active pixel sensors (APS). According to the integration level, the CMOS image sensors are categorized into three-transistor active pixel sensors (3T-APS), pined photodiode four-transistor active pixel sensors (4T-APS); and pined photodiode five-transistor active pixel sensors (5T-APS), among which the 4T-APS are the most popular ones in the market. According to the incident direction of the light to the optical sensing area, the CMOS image sensors are categorized into Front-side-illumination (FSI) image sensors and Back-side-illumination (BSI) image sensors.

Currently, there are certain issues in the design of the pixel units of the high-speed CMOS image sensors. First, because the exposure time is relative short, a CMOS image sensor needs a large area photodiode (PD) to enhance the sensitivity. The large area PD causes the lateral electric field of the PD region to be weak. Thus, the charges of the signal can only be transported by the diffusion of carriers; and the transport efficiency is low. Second, the image lag phenomenon severely affects the image quality of the CMOS image sensors. How to avoid the image lag is a big challenge in the design of the high-speed CMOS image sensors. Third, the full well capacity (FWC) is an important parameter affecting the performance of the CMOS image sensors, and studies were conducted on how to increase the FWC so as to increase the dynamic range and the signal-to-noise ratio as another approach to enhance the image performance of the CMOS image sensors.

The disclosed device structures and methods are directed to solve one or more problems set forth above and other problems in the art.

BRIEF SUMMARY OF THE DISCLOSURE

One aspect of the present disclosure includes a method for fabricating a CMOS image sensor. The method includes providing a substrate having a first region and a second region connecting with the first region at a first end of the first region; forming a transfer transistor on the surface of the substrate in the second region; forming a first implanting region in the substrate in the first region using a first mask; forming a second implanting region in the first implanting region, the first implanting region being separated into a third implanting region on the second implanting region and a fourth implanting region under the second implanting region by the second implanting region; forming a fifth region in the second region at the first end using a second mask, the fifth region connecting the third implanting region with the fourth implanting region.

Another aspect of the present disclosure includes a CMOS image sensor. The CMOS image sensor includes a substrate having a first region and a second region connecting with the first region at a first end of the first region; a transfer transistor formed on the surface of the substrate in the second region; a floating diffusion (FD) region formed in the surface of the substrate at one side of the transfer transistor in the second region; a third implanting region formed in the surface of the substrate 200 in the first region, being formed from a first implanting region; a second implanting region and an adjacent fifth implanting region formed under the third implanting region; and a fourth implanting region formed under the second implanting region and the fifth implanting region, being electrically connected with the third implanting region by the fifth implanting region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 5:
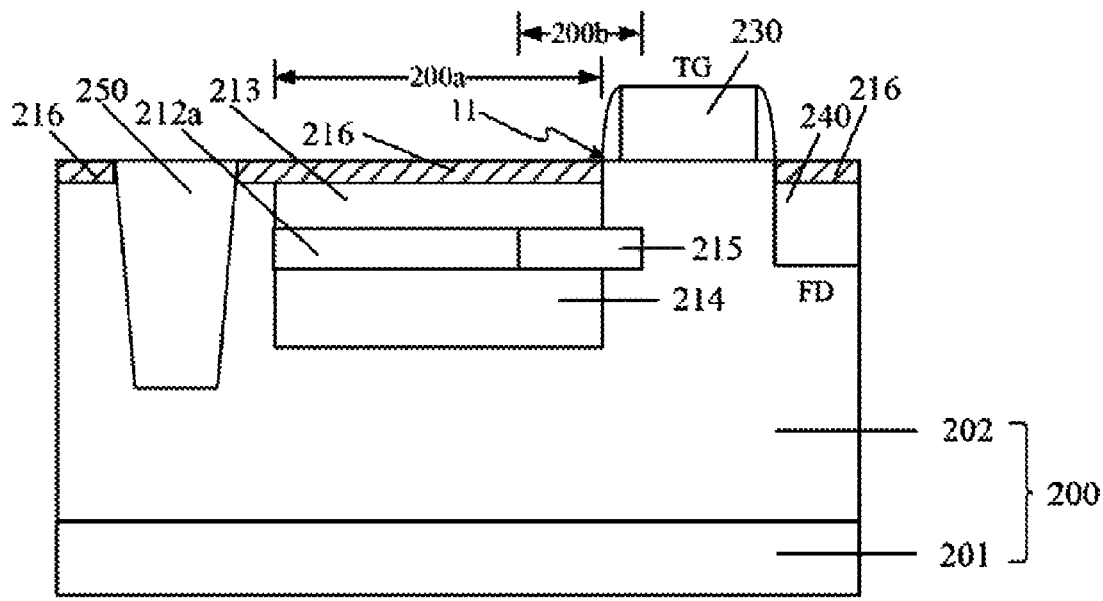
Figure 6:
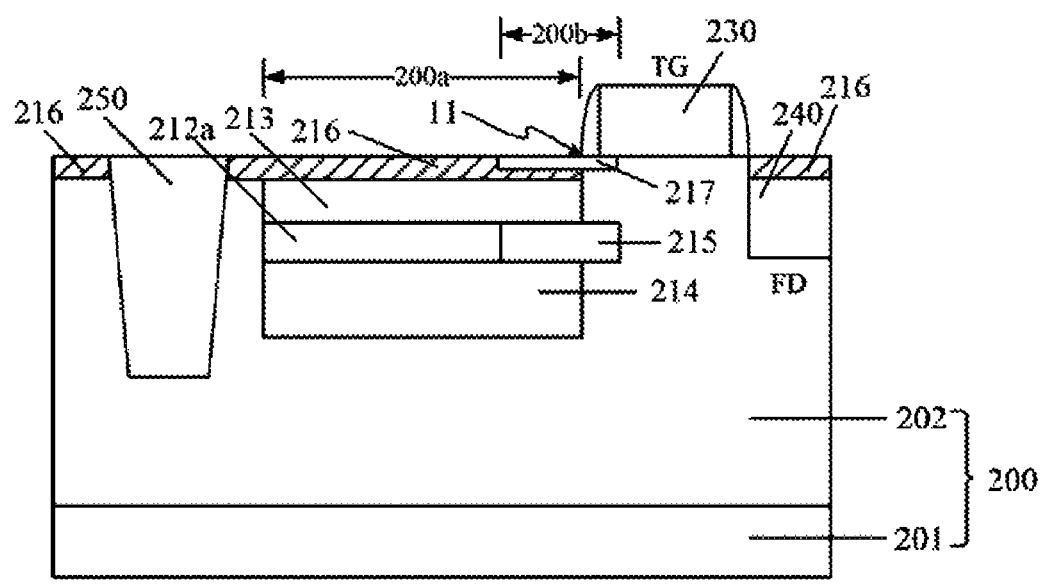
Figure 7:
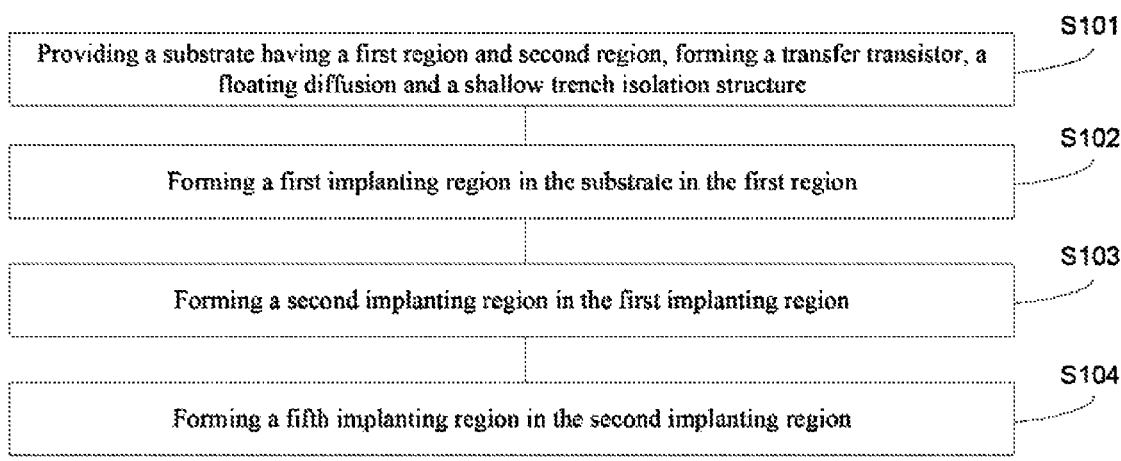
FIG. 7 illustrates an exemplary fabrication process of a CMOS image sensor consistent with the disclosed embodiments.

FIG. 7 illustrates an exemplary fabrication process of a CMOS transistor consistent with the disclosed embodiments; and FIGS. 1-6 illustrate semiconductor structures corresponding to certain stages of the exemplary fabrication process.

Figure 1:
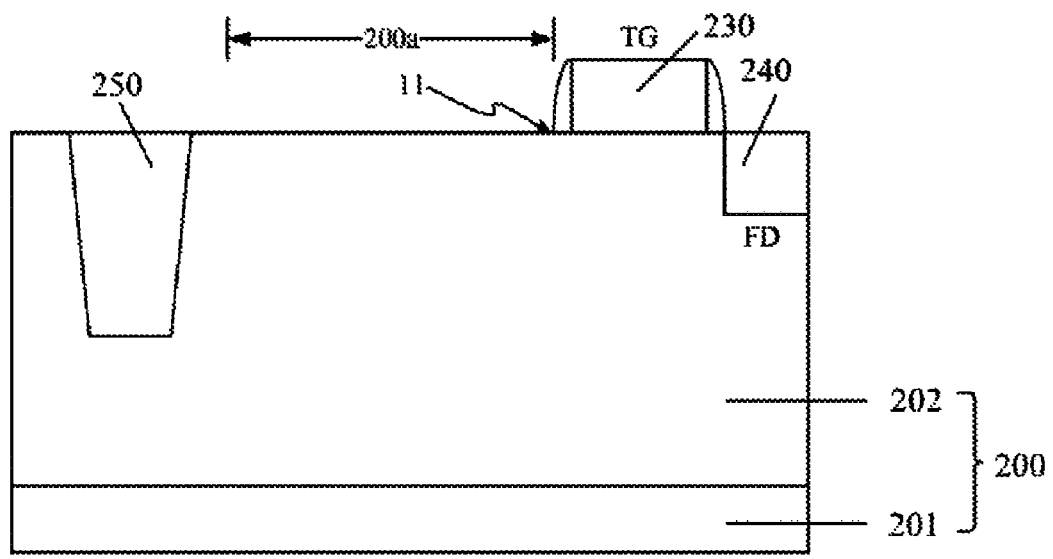
FIGS. 1-6 illustrate semiconductor structures corresponding certain stages of an exemplary fabrication process of a CMOS image sensor consistent with the disclosed embodiments.

As shown in FIG. 7, at the beginning of fabrication process, a substrate with certain structures is provided (S101). FIG. 1 illustrates a corresponding semiconductor structure.

As shown in FIG. 1, a substrate 200 is provided. The substrate 200 may include a base substrate 201 and an epitaxial layer 202. The epitaxial layer 202 is formed on a surface of the base substrate 201.

The epitaxial layer 202 may have a first conductive type (or doping type). Further, the epitaxial layer 202 may have a first region 200a and a second region (not labeled). The first region 200a may be a region for forming photosensitive devices. In one embodiment, the second region may be connected with the first region 200a at a first end 11 of the first region 200a.

Further, a transfer transistor 230 (i.e., a transfer gate, TG), a floating diffusion region (FD) 240 and a shallow trench isolation structure 250 may be formed in the epitaxial layer 202. The transfer transistor 230 may be formed in a region on the surface of the epitaxial layer 202; and the floating diffusion region 240 may be formed in a region inside the epitaxial layer 202. The first region 200a may connect with the transfer transistor 230 at the first end 11 of the first region 200a.

The substrate 201 may be made of any appropriate semiconductor material, such as silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the substrate 201 is made of single crystalline silicon. The substrate 201 provides a base for subsequent structures and processes.

The epitaxial layer 202 may be made of any appropriate material, such as silicon, silicon germanium, or germanium, etc. Further, the epitaxial layer 202 may be doped with any appropriate type. In one embodiment, the epitaxial layer 202 is P-typed doped. That is, the first conductive type is P-type. The doping concentration of the epitaxial layer 202 may be approximately $1.5E15$ atom/cm$^3$.

Figure 2:
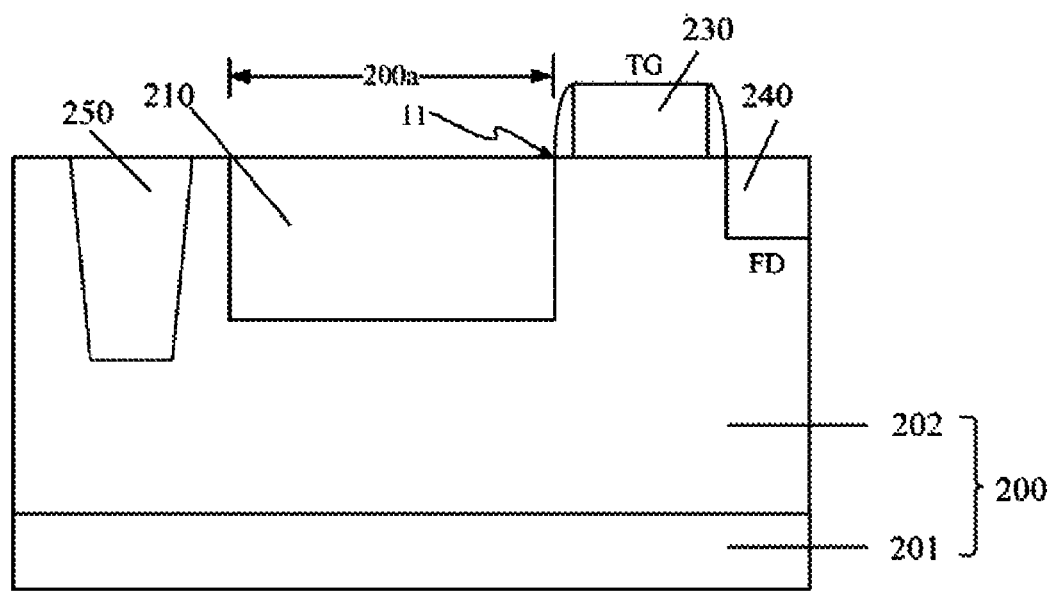

Returning to FIG. 7, after forming the epitaxial layer 202, a first implanting region may be formed (S102). FIG. 2 illustrates a corresponding semiconductor structure.

As shown in FIG. 2, a first implanting region 210 is formed in the first region 200a by an ion implantation process. The lateral size of the first implanting region 210 may be equal to the lateral size of the first region 200a.

The process for forming the first implanting region 210 may include providing a first mask; forming a first mask material layer on the first region 200a; forming a first patterned mask exposing the first region 200a by etching the first mask material layer using the first patterned mask as an etching mask; and performing an ion implantation process on the exposed first region 200a to form the first implanting region 210. The first implanting region 210 may be doped with a second conductive type (or doping type). The second conductive type may be opposite to the first conductive type.

In one embodiment, the first conductive type is P-type, and the second conductive type is N-type. Thus, the first Implanting region 210 may be referred to as a deep diode N-type (DDN) well region. The DDN well region may be used to form an electron storage space. Correspondingly, other regions of the substrate 200 may be referred to as deep diode P-type (DDP) well regions. The DDP well regions may be used to form pixel-to-pixel isolations.

The depth of the first implanting region 210 may be any appropriate value. In one embodiment, the depth of the first implanting region 210 may be in a range of approximately 0.9 μm-1.2 μm. The doping concentration of the first implanting region 210 may be in a range of approximately $1E14$ atom/cm$^3$-$3E16$ atom/cm$^3$.

The ion implantation process for forming the first implanting region 210 may include a first ion implantation process, a second ion implantation process, and a third ion implantation process, etc. In one embodiment, the doping dosages of the first ion implantation process, the second ion implantation process and the third ion implantation process may be identical in a range of approximately $1.6E12$ atom cm$^2$-$2.0E12$ atom cm$^2$. The powers of the ion implantation processes may be gradually increased.

Specifically, the ions of the first ion implantation process may be P ions. The energy of the first ion implantation process may be approximately 100 KeV. The doping dosage of the first ion implantation process may be approximately $1.8E12$ atom/cm$^2$. The ions of the second ion implantation process may be P ions. The energy of the second ion implantation process may be approximately 250 KeV. The doping dosage of the second ion implantation process may be approximately $1.8\ E12$ atom/cm$^2$. The ions of the third ion implantation process may be P ions. The energy of the third ion implantation process may be approximately 450 KeV. The doping dosage of the third ion implantation process may be approximately $1.8\ E12$ atom/cm$^2$.

In certain other embodiments, the doping dosages of the first ion implantation process, the second ion implantation process, and the third ion implantation process may be different in a range of approximately $1.6E12$ atom/cm$^2$-$2.0E12$ atom/cm$^2$. The powers of the ion implantation processes may be gradually increased.

Specifically, the ions of the first ion implantation process may be P ions. The energy of the first ion implantation process may be approximately 100 KeV. The doping dosage of the first ion implantation process may be approximately $1.6E12$ atom/cm$^2$. The ions of the second ion implantation process may be P ions. The energy of the second ion implantation process may be approximately 250 KeV. The doping dosage of the second ion implantation process may be approximately $1.8E12$ atom/cm$^2$. The ions of the third ion implantation process may be P ions. The energy of the third ion implantation process may be approximately 450 KeV. The doping dosage of the third ion implantation process may be approximately $2.0E12$ atom cm$^2$.

In certain other embodiments, the doping dosages of the first ion implantation process, the second ion implantation process, and the third ion implantation process may be different. The powers of the ion implantation processes may be gradually decreased.

By sequentially using the first ion implantation process, the second ion implantation process and the third ion implantation process, the junction depth of the FN junction formed by the first implanting region 201 and the epitaxial layer 202 may be increased; and the vertical depletion region may be expanded. Such a condition may facilitate to better collect the incident photons on the bottom of the substrate 201 to perform an optical-electrical conversion to increase the quantum efficiency of the image sensor under the Backside-illumination; (BSI) mode. At the same time the Full-Well-Capacity (FWC) of the pixel unit may be increased.

Figure 3:
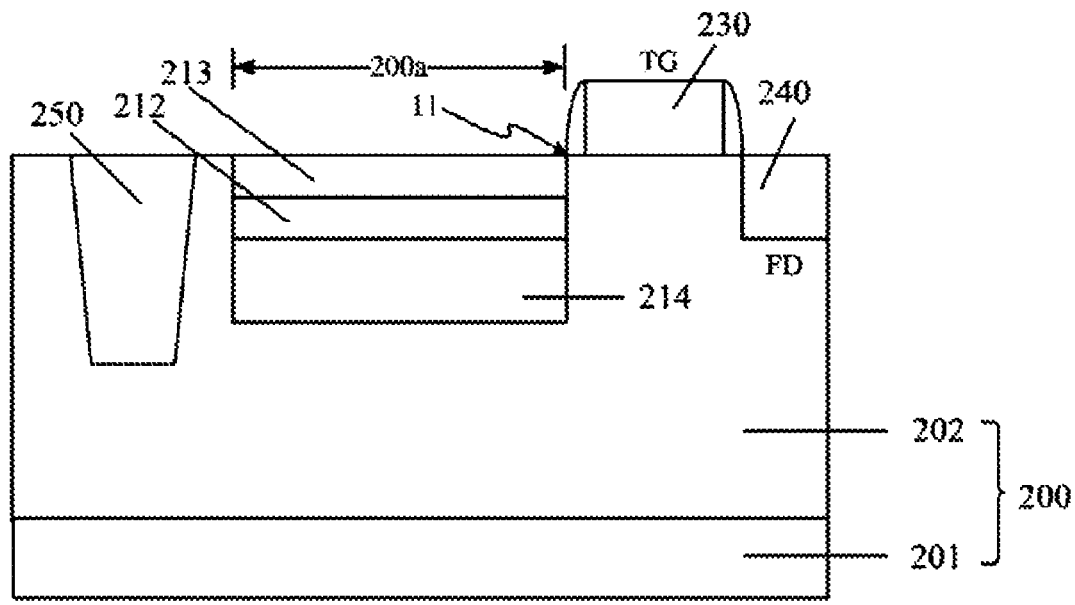

Returning to FIG. 7, after forming the first implanting region 210, a second implanting region may be formed (S103). FIG. 3 illustrates a corresponding semiconductor structure.

As shown in FIG. 3, a second implanting region 212 is formed inside the first implanting region 210 (referring to FIG. 2) by an ion implantation process. The first implanting region 210 may be separated by the second implanting region 212. The portion of the first implanting region 210 above the second implanting region 212 may be referred to as a third implanting region 213; and the portion of the first implanting region 210 under the second implanting region 212 may be referred to as a fourth implanting region 214. That is, the first implanting region (DDN well) may be divided into two regions. The second implanting region 212 may have the first conductive type.

In one embodiment, as shown in FIGS. 2-3, the volume ratio between the second implanting region 212 and the first implanting region 210 may be approximately 1:3. The depth of the second implanting region 212 may be in a range of approximately $2/5$-$3/5$ of the depth of the first implanting region 212. The doping concentration of the second implanting region 212 may be in a range of approximately 1E15 atom/cm$^3$-3E16 atom/cm$^3$.

The ions for forming the second implanting region 212 may have the first conductive type; and the doping dosage of the second implanting region 212 may be greater than any of the dosages of the first ion implantation process, the second ion implantation process and the third ion implantation process for forming the first implanting region 210. Thus, the second implanting region 212 may have the first doping type.

In one embodiment, the ions for forming the second doping region 212 by the ion implantation process are B ions. The energy of the ion implantation process may be approximately 160 KeV. The dosage of the ion implantation process may be approximately 3.5E12 atom/cm$^2$.

Figure 4:
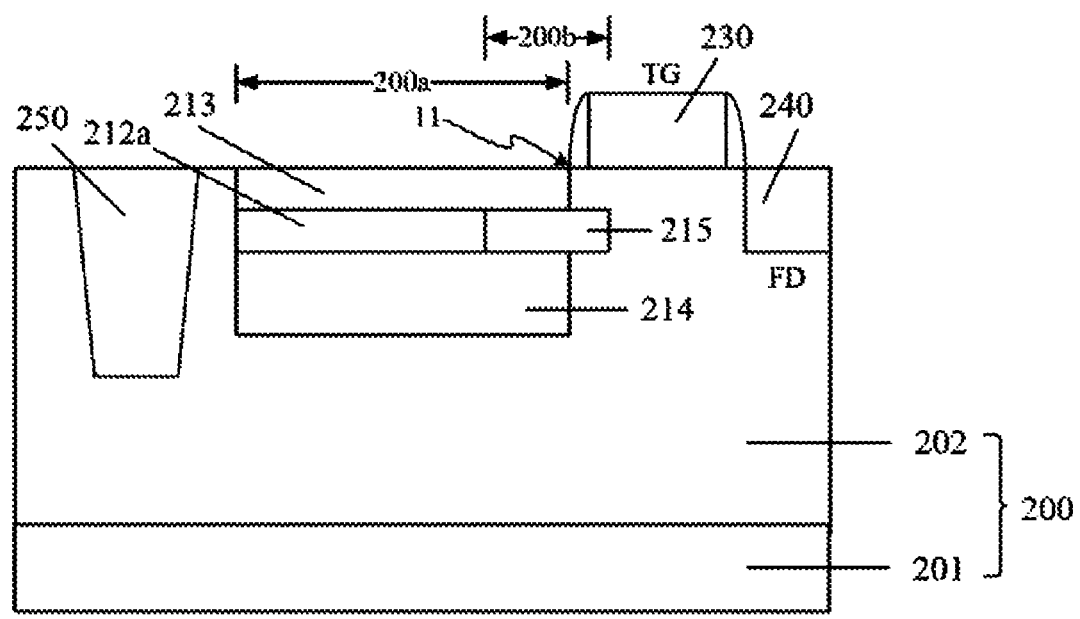

Returning to FIG. 7, after forming the second doping region 212, a fifth implanting region may be formed (S104). FIG. 4 illustrates a corresponding semiconductor structure.

As shown in FIG. 4, a fifth implanting region 215 is formed in the portion of the second implanting region 212 close to the transfer transistor 230. The remaining portion of the second implanting region 212 may be referred to as a remaining second implanting region 212a.

The fifth implanting region 215 may be formed by providing a second mask; and forming a second patterned mask layer (not shown) on the substrate 200. The second patterned mask layer may expose the first end 11 of the first region 200a. The region of the surface of the substrate 200 exposed by the second patterned; mask layer may be referred to as a second region 200b. After forming the second patterned mask layer, an ion implantation process may be performed on the second region 200b; and the fifth implanting region 215 may be formed.

The fifth implanting region 215 may have the second conductive type. The fifth implanting region 215 may electrically connect the third implanting region 213 with the fourth implanting region 214.

The conductive type of the ions for forming the fifth implanting region 215 may be identical to the conductive type of the ions for forming the first implanting region 210 (referring to FIG. 2); and may be opposite to the conductive type of the ions for forming the second implanting region 212. Thus, to cause the fifth implanting region 215 to have the second conductive type, the sum of the dosage of the ion implantation process for forming the fifth implanting region 215 and the dosage of the ion implantation process for forming the first implanting region 210 may be greater than dosage of the implantation process for forming second ion implanting region 212. Such a condition may be able to achieve an electrical connection between the third implanting region 213 and the fourth implanting region 214 by the fifth implanting region 215.

Referring to FIG. 4, the electrically connected third implanting region 213, the fourth implanting region 214 and the fifth implanting region 215 may form a U-shaped implanting region; and U-shaped implanting region may have the second conductive type. The second implanting region 212a may be have the first conductive type; and may be an inserting layer inside the U-shaped implanting region.

The U-shaped implanting region may be easy to have residue charges. However, because the insertion of the second implanting region 212a, i.e., with the help of the inserting layer, the charges in the U-shaped implanting region may achieve a full depletion. Thus, the FWC and the electron transfer efficiency (CTE) may be increased. Further, in the pixel unit, the exposure of the previous frame may not generate residual charges to the next frame. Thus, the image lag issue may not be generated.

In one embodiment, the region covered by the second mask may be from a position on the first region 200a having an offset of approximately 0.2 µm with the first end 11 to a position on the surface of the substrate 200 under the transfer transistor 230 having an offset of approximately 0.1 µm with the first end 11. The offset of approximately 0.1 µm with the first end 11 may be for subsequently forming a sixth implanting region; and may cause the sixth implanting region to be able to cover the path for electrons to transfer from the U-shaped implanting region to the channel region.

In one embodiment, the ions for forming the fifth implanting region 215 may be phosphor ions. The energy of the ion implantation process for forming the fifth implanting region 215 may be approximately 250 KeV; and the dosage may be approximately 3E12 atom/cm$^2$.

Optionally and additionally, after forming the fifth implanting region 215, a pinning layer 216 may be formed. FIG. 5 illustrates a corresponding semiconductor structure.

As shown in FIG. 5, a pinning layer 216 is formed in the surface of the substrate 200 by an ion implantation process. The pinning layer 216 may be used to reduce the dark current of the imaging sensor. The pinning layer 216 may have the first conductive type.

In one embodiment, the pinning layer 216 may be formed by an ion implantation process without a mask layer; and the ion implantation process may be directly performed on the surface of the substrate 200. The pinning layer 216 is formed in the entire surface of the substrate 200 except the region under the transfer gate 230 and the region at the shallow trench isolation structure 250.

In one embodiment, the doping concentration of the pinning layer 216 may be approximately 2E18 atom/cm$^3$. The depth of the pinning layer 216 may be smaller than approximately 0.2 µm. The ions for forming the pinning layer 216 may be $BF_2$ ions. The energy of the ion implantation process for forming the pinning layer 216 may be approximately 30 KeV; and the dosage of the ion implantation process may be approximately 5E12 atom/cm$^2$.

Before or after forming the fifth implanting region 215, as shown in FIG. 6, a sixth implanting region 217 may be formed in the surface of the substrate 200 in the second region 200b. The sixth implanting region 217 may be formed by performing an ion implantation process on the second region 200b using the second mask as a mask.

The sixth implanting region 217 may have the first conductive type. The sixth implanting region 217 mays used to reduce the image lag, and to increase the electron transfer efficiency (CTE). The sixth implanting region 217 may form a non-uniform channel in the transport layer of the pixel unit (i.e., TP layer). Thus, the electron potential at the photodiode (PD) side may always be higher than the electron potential at the floating diffusion (FD) 240 side; and the image lag issue may be reduced.

The region covered the second mask may be from a position on first region 200a having an offset of approximately 0.2 μm with the first end 11 to a position on the surface of the substrate 200 under the transfer transistor 230 having an offset of approximately 0.1 μm with the first end 11. Such a region may be able to cause the sixth implanting region 217 to cover the path for the electrons to transfer from the U-shaped region to the channel region. Thus, the sixth implanting region 217 may function as an insulation layer between the U-shaped implanting region and the channel region. Accordingly, the reflux of the electrons transferred to the floating diffusion region 240 into the U-shaped region through the transfer transistor 230 when the transfer transistor 230 is turned on may be prevented. If the electrons transferred to the floating region reflux back to the U-shaped region through the transfer transistor 230 when the transfer transistor 230 is turned on, the image lag may occur; and the electron transfer efficiency (CTE) may be reduced.

The doping concentration of the sixth implanting region 217 may significantly affect the improvement of the image lag of the pixel unit and the increasing of the electron transfer efficiency. In one embodiment, by adjusting the dosage of the ion implantation process for forming the sixth implanting region 217, the barrier potential, balance between the photodiode and the floating diffusion region 240 at the two ends of the transfer transistor 230 may be adjusted. By adjusting the barrier potential balance, the possibility for charges to reflux from the floating diffusion region 240 back to the photodiode when the transfer transistor 230 is turned on may be reduced. Accordingly the image lag may be reduced. Further, because the possibility of the charges to flux may be reduced, the electron transfer efficiency (CTE) of the pixel unit may be increased.

In one embodiment, the doping concentration of the sixth implanting region 217 may be in a range of approximately 4E16 atom/cm$^3$-5E16 atom/cm$^3$. The depth of the sixth implanting region 217 may be approximately 0.1 μm. The ions for forming the sixth implanting region 217 may be $BF_2$ ions. The dosage of the ion implantation process may be approximately 4E12 atom/cm$^2$.

Thus, a CMOS image sensor may be formed by the disclosed methods and processes. The corresponding CMOS image sensor is illustrated in FIG. 6. The photodiode in the CMOS image sensor may be referred to as a lateral graded-doping profile pinned photodiode (GD-PPD).

As shown in FIG. 6, the CMOS image sensor may include a substrate 200 having a first region 200a and a second region (not labeled); and a transfer gate 230 formed on the surface of the substrate 200 in the second region connecting with the first region 200a at a first end 11. The CMOS image sensor may also include a floating diffusion (FD) region 240 formed in the surface of the substrate 200 at one side of the transfer transistor 230 and a third implanting region 213 formed in the surface of the substrate in the first region 200a that is formed from a first implanting region (not labeled). Further, the CMOS image sensor may also include a second implanting region 212a and an adjacent fifth implanting region 215 formed under the third implanting region 213; and a fourth implanting region 214 formed under the second implanting region 212a and the fifth implanting region 215. Further, the CMOS image sensor may also include sixth implanting region 216 formed in the surface of the substrate 200 in a second region 200b overlapping a portion of the first region 200a and the a portion of the surface of the substrate 200 adjacent to first region 200a; and a pinning layer 216 covering the third implanting region 213, the floating diffusion region 240 and the surface of the substrate 200. Further, the CMOS image sensor may also include a shallow trench isolation structure 250 formed in the surface of the substrate 200. The detailed structures and intermediate structures are described above with respect to the fabrication processes.

Thus, according to the disclose processes and structures, by the using the disclosed ion implanting scheme, a first implanting region with a second conductive type and a second implanting region with a first conductive type may be formed using a first mask. The second implanting region may be inside of the first implanting region; and may separate the first implanting region into a third implanting region and a fourth implanting region. Then, a fifth implanting region may be formed using a second mask. The fifth implanting region may electrically connect the third implanting region with the fourth implanting region to form a layered diode structure, i.e., a lateral graded-doping profile pinned photodiode (GD-PPD). Such a GD-PPD structure may increase the full well capacity (FWC), the charge transport efficiency (CTE) and the dynamical range the pixel cell of the CMOS image sensor.

Further, a sixth implanting region may be formed in the CMOS image sensor. The sixth implanting region may be used to adjust the potential barrier balance between the photodiode and the floating diffusion region at the two ends of the transfer transistor. By adjusting the potential barrier balance, the possibly for the charges to reflux back from the floating diffusion region to the photodiode when the transfer transistor is turned on may be reduced; and the image lag may be reduced. Further, because the reflux possibility of the charges may be reduced, the charge transport efficiency (CTE) may be further improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof without departing from the spirit and principle of the present invention, falls within the true scope of the present invention.

What is claimed is:

1. A method for fabricating a CMOS image sensor, comprising:
    providing a substrate having a first region and a second region connecting with the first region at a first end of the first region;
    forming a transfer transistor on a surface of the substrate in the second region;
    forming a first implanting region in the substrate in the first region using a first mask;
    forming a second implanting region inside the first implanting region, the first implanting region being separated into a third implanting region on the second implanting region and a fourth implanting region under the second implanting region by the second implanting region; and
    forming a fifth implanting region in the second region at the first end using a second mask, the fifth implanting region connecting the third implanting region with the fourth implanting region, wherein:

the substrate has a first conductive type;
the first implanting region has a second conductive type opposite to the first conductive type;
the second implanting region has the first conductive type;
the third implanting region and the fourth implanting region have the second conductive type; and
the fifth implanting region has the second conductive type.

2. The method according to claim 1, wherein forming first implanting region comprises:
performing a first ion implantation process;
performing a second ion implantation process; and
performing a third implantation process.

3. The method according to claim 2, wherein:
a conductive type of ions of the first ion implantation process, the second ion implantation process and the third ion implantation process is the second conductive type.

4. The method according to claim 1, wherein:
energies of the first ion implantation process, the second ion implantation process and the third ion implantation process are gradually increased.

5. The method according to claim 4, wherein:
the energy of the first ion implantation process is approximately 100 KeV;
a dosage of the first ion implantation process is approximately 1.8E12 atom/cm$^2$;
the energy of the second ion implantation process is approximately 250 KeV;
a dosage of the second ion implantation process is approximately 1.8E12 atom/cm$^2$;
the energy of the third ion implantation process is approximately 450 KeV;
a dosage of the third ion implantation process is approximately 1.8E12 atom/cm$^2$.

6. The method according to claim 1, wherein:
ions implanted in the second implanting region are boron ions;
an energy of the ion plantation process for forming the second implanting region is approximately 160 KeV; and
a dosage of boron ions is approximately 3.5E12 atom/cm$^2$.

7. The method according to claim 1, wherein;
a region covered by the second mask is from a position in the first region having a distance in a range of approximately 0.18 μm-0.22 μm with the first end of the first region to a position on the surface of the substrate under tire transfer transistor having a distance in a range of approximately 0.08 μm-0.12 μm with the first end of the first region.

8. The method according to claim 7, wherein:
ions implanted in the fifth implanting region are phosphor ions;
an energy of the ion implantation process for forming the fifth implanting region is approximately 250 KeV; and
a dosage of phosphor ions is approximately 3E12 atom/cm$^2$.

9. The method according to claim 1, after forming the fifth implanting region, further comprising:
forming a pinning layer in the surface of the substrate by an ion implantation process.

10. The method according to claim 9, wherein:
ions of the ion implantation process are BF$_2$ ions;
an energy of the ion implantation process is approximately 30 KeV; and
a dosage of the BF$_2$ ions is approximately 5E12 atom/cm$^2$.

11. The method according to claim 1, before forming the fifth implanting region further comprising:
forming a sixth implanting region in the surface of the substrate by an ion implantation process using the second mask.

12. The method according to claim 11, wherein:
ions of the ion implantation process are BF$_2$ ions;
an energy of the ion implantation process is approximately 30 KeV; and
a dosage of BF$_2$ ions is approximately 5E12 atom/cm$^2$.

13. The method according to claim 1, after forming the fifth implanting region, further comprising:
forming a sixth implanting region in the surface of the substrate using the second mask.

14. The method according to claim 13, wherein:
ions of the ion implantation process are BF$_2$ ions;
an energy of the ion implantation process is approximately 30 KeV; and
a dosage of BF$_2$ ions is approximately 5E12 atom/cm$^2$.

* * * * *